(12) United States Patent
Friend et al.

(10) Patent No.: US 6,498,049 B1
(45) Date of Patent: Dec. 24, 2002

(54) DISPLAY DEVICES

(75) Inventors: Richard H. Friend, Cambridge (GB); Carl R. Towns, Essex (GB); Julian C. Carter, Cambridge (GB); Stephen K. Heeks, Cambridge (GB); Hermann F. Wittman, Cambridge (GB); Karl Pichler, Wappingers Falls, NY (US); Ichio Yudasaka, Tokyo (JP)

(73) Assignees: Cambridge Display Technology, Cambridge (GB); Seiko Epson Corporation, Tokyo (JP)

( * ) Notice: Subject to any disclaimer, the term of this patent is extended or adjusted under 35 U.S.C. 154(b) by 132 days.

(21) Appl. No.: 09/640,436

(22) Filed: Aug. 17, 2000

(Under 37 CFR 1.47)

Related U.S. Application Data

(63) Continuation of application No. PCT/GB99/00530, filed on Feb. 19, 1999.

(30) Foreign Application Priority Data

Feb. 23, 1998 (GB) ............................................. 9803763

(51) Int. Cl.⁷ .............................................. H01L 21/00
(52) U.S. Cl. ........................................... 438/34; 257/89
(58) Field of Search ....................... 438/34, 36, 44–47, 438/22–23, 27, 29, 800; 257/40, 213, 84, 88–93; 313/498, 502–504

(56) References Cited

U.S. PATENT DOCUMENTS 4,539,507 A 9/1985 VanSlyke et al. ........... 313/504

FOREIGN PATENT DOCUMENTS

| EP | 0 390 569 A2 | 10/1990 |
| EP | 0 562 981 A1 | 9/1993 |
| EP | 0 615 257 A2 | 9/1994 |
| EP | 0 717 445 A2 | 6/1996 |
| GB | 2 330 331 A | 4/1999 |
| WO | WO 85/03596 | 8/1985 |
| WO | WO 90/13148 | 11/1990 |
| WO | WO 96/08047 | 3/1996 |
| WO | WO 97/07654 | 2/1997 |

OTHER PUBLICATIONS

T.R. Hebner, C.C. Wu, D. Marcy, M.H. Lu, and J.C. Sturn "Ink–jet printing of doped polymers for organic light emitting devices" Applied Physics Letters, vol. 72, No. 5, Feb. 2, 1998, pp. 519–521 (provided).*

(List continued on next page.)

Primary Examiner—Craig Thompson
(74) Attorney, Agent, or Firm—Marshall, Gerstein & Borun

(57) ABSTRACT

A method for forming a display device, comprising: depositing a thin-film transistor switch circuit on a substrate; depositing by ink-jet printing an electrode layer of light transmissive conductive organic material in electrical contact with the output of the thin-film transistor circuit; and depositing an active region of the device over the electrode layer.

21 Claims, 5 Drawing Sheets

OTHER PUBLICATIONS

Angelopoulos et al., "Applications of Conducting Polyanilanes in Computer Manufacturing Process" "Intrinsically Conducting Polymers: An Emerging Technology," Aldassi (ed) Proceedings of NATO Advanced Research Workshop on Applications of Intrinsically Conducting Polymers, Burlington, Vt USA, pp. 147–156 (1993) Kluwer Academic Publishers, Netherlands).

Burroughes et al., "Light–emitting diodes based on conjugated polymers," *Nature*:347, 539–541 (Oct. 11, 1990).

Carter et al., *Appl. Phys. Lett.*, 71:34 (1997).

Gustafsson et al., "Flexible light–emitting diodes made from soluble conducting polymers," *Nature*:357 (6378), 477–479 (Jun. 11, 1992).

Hebner et al., "Ink–jet printing of dope polymers for organic light emitting devices," *Appl. Phys. Lett.* 72(5):519–521 (Feb. 2, 1998).

Lien et al., "Conducting Polyaniline as a Potential ITO Replacement for Flat Panel Applications" *Conference of Record of the 1997 International Display Research Conference and International Workshops on LCD Technology and Emissive Technology*, Toronto, pp. 1–4 (Sep. 15–19, 1997).

International Preliminary Examination Report.

International Search Report for PCT/GB99/00530.

* cited by examiner

DISPLAY DEVICES

This is a continuation of International Application No. PCT/GB99/00530 filed Feb. 19, 1999, the entire disclosure of which is incorporated herein by reference.

This invention relates to display devices, especially ones that use an organic material for light emission.

One type of electroluminescent display device is described in PCT/WO9013148, the contents of which are incorporated herein by reference. The basic structure of this device is a light-emitting polymer film (for instance a film of a poly(-phenylenevinylene)—"PPV") sandwiched between two electrodes, one of which injects electrons and the other of which injects holes. The electrons and holes excite the polymer film, emitting photons. These devices have potential as flat panel displays.

Another type of organic light-emitting device is a small molecule device, details of which are given in U.S. Pat. No. 4,539,507, the contents of which are incorporated herein by reference. These have a light-emitting layer which comprises at least one small molecule material such as tris(8-hydroxyquinoline)aluminium ("Alq$_3$") sandwiched between the two electrodes.

In an organic light-emitting device the organic light-emitting layer is generally divided into individual pixels, which can be switched between emitting and non-emitting states by altering the current flow through them. The pixels are generally arranged in orthogonal rows and columns. Two alternative arrangements for controlling the pixels are generally used: passive matrix and active matrix. In a passive matrix device one of the electrodes is patterned in rows and the other in columns. Each pixel can be caused to emit light by applying an appropriate voltage between the row and column electrodes at whose intersection it lies. This calls for high peak brightnesses from the pixels, because each pixel can only be powered for a fraction of the scan cycle. In an active matrix display the high peak brightness is not required because each pixel can be left in an emitting state whilst another pixel is addressed.

FIG. 1 illustrates a circuit for driving one pixel in a thin-film transistor ("TFT") active matrix display. The circuit comprises the pixel itself, illustrated as diode 1, which is connected between electrodes 2 and 3. Electrodes 2 and 3 are connected to all the pixels of the device and a voltage sufficient for emission from the pixel is applied constantly between the electrodes 2 and 3. At least part of the switch circuit 4, which in practice is embodied by thin-film transistors, lies between electrode 3 and the pixel 1. (There may also, or alternatively, be circuitry between the pixel/diode 1 and the electrode 2). The switch circuit is controlled by way of row and column electrodes 5,6. To cause the pixel 1 to emit light, voltages are applied to the electrode 6, to switch the switching transistor 7 on, and to electrode 5 to charge the storage capacitor 8. Electrodes 6 is then turned off. Since the capacitor 8 is charged the current transistor 9 is switched on and the voltage applied at electrode 3 is applied to the pixel, causing it to emit. Although it requires a more complex circuit than a passive matrix device this arrangement has the advantage that the pixel can be held in an emitting state by means of the capacitor 8 whilst other pixels on different rows and columns are addressed by their row and column electrodes.

FIG. 2 shows a schematic plan view of typical switching circuitry associated with a pixel of an organic light-emitting device and FIG. 3 shows a cross-section of the circuitry of FIG. 2 on the line 1A–1A'. The circuitry comprises a scan (or gate) line 10 (which corresponds to the electrode 6 in FIG. 1), a signal (or data) line 11 (which corresponds to the electrode 5 in FIG. 1), a common line 12 (which corresponds to the electrode 3 in FIG. 1), a switching thin film transistor shown generally at 13 (which corresponds to the transistor 7 in FIG. 1), a storage capacitor shown generally at 14 (which corresponds to the capacitor 8 in FIG. 1) and a current transistor shown generally at 15 (which corresponds to the transistor 9 in FIG. 1). As FIG. 3 shows, insulating layers 16 of SiO$_2$ separate the component parts of the circuitry, and the circuitry is deposited on a glass substrate 17. At the output of transistor 15 is a contact region 29 which constitutes the output terminal of the circuit.

Banks 30 of insulating material (not shown in FIG. 2) are formed to constrain the edges of the light-emitting region itself. To connect between the output terminal of the TFT circuit and the light-emitting material of the pixel there is an electrode 19 of transparent indium-tin oxide ("ITO"). This makes contact with the contact region 29 and provides a wide pad which forms the anode of the emitting device. A layer 33 of light-emitting material is deposited on the pad (corresponding to pixel 1 in FIG. 1) and finally a cathode 31 (corresponding to electrode 2 in FIG. 1) is deposited on top of it. Light emission from the pixel towards a viewer is generally in the direction into the page in FIG. 2 and as shown by arrow B in FIG. 3. Therefore, to prevent it obscuring the emitted light, the TFT circuitry is located generally to the side of the light-emitting material 33.

ITO has good transparency, low sheet resistance and established processing routes, and it has a low resistance which makes it especially useful in passive matrix displays where, because each pixel can only emit for part of the time, high peak through-currents are needed. However, the processing of the ITO can cause problems. Typically, the ITO is deposited as a continuous layer (e.g. by sputtering or evaporation) over the entire device. It must then be patterned to give separate pads 19 for each pixel of the device. The patterning is typically lithographic, with the ITO being etched to remove the unwanted areas. This causes problems because the materials used for the etching can easily seep into the TFT structure, through voids between the component regions, and damage the circuitry. Damage to the circuitry of only one pixel of a display may cause the entire display to be rejected.

Devices have been made more stable by using a layer of a conductive polymer between the ITO and the light emitting layer (see, for example, J Carter et al., Appl. Phys. Lett. 71 (1997) 34), and in other fields, such as the field of non-emissive devices the ITO layer has been omitted (see, for example, A Lien et al., "Conducting Polyaniline as a Potential ITO Replacement for Flat Panel Applications", Proceedings of the International Display Research Conference, Society of Information Display, Toronto, Sep. 15–19, 1997, p. 1).

According to the present invention there is provided a method for forming a display device, comprising: depositing a thin-film transistor switch circuit on a substrate; depositing by ink-jet printing an electrode layer of light transmissive conductive organic material in electrical contact with the output of the thin-film transistor circuit; and depositing an active region of the device.

Preferably the active region is also deposited by ink-jet printing.

The active region may preferably be in the form of a layer.

The active region may be a light-emitting region (for instance comprising an organic light-emitting material) or a region the passage of light through which can be controlled (for instance comprising a liquid crystal material).

The said organic light emitting material may be a polymer material. The organic light-emitting material is preferably a conjugated material. A suitable material is a semiconductive conjugated polymer such as PPV, or a derivative thereof. The light-emitting material suitably is or comprises PPV, poly(2-methoxy-5(2'-ethyl)hexyloxyphenylenevinylene) ("MEH-PPV"), a PPV-derivative (e.g. a di-alkoxy derivative), a polyfluorene and/or a co-polymer incorporating polyfluorene segments, PPVs and/or related co-polymers. As an alternative to ink-jet printing it could be deposited by spin-coating, dip-coating, blade-coating, meniscus-coating, self-assembly etc. The constituent of the light-emitting region and/or its precursor may be water-based: examples are precursor-based PPVs. An alternative material is an organic molecular light-emitting material, e.g. $Alq_3$, or an organic oligomer light-emitting material, or any other small sublimed molecule or conjugated polymer electroluminescent material as known in the prior art.

The electrode layer suitably has a sheet resistance less than 200 kOhm/square and preferably in the range from 20 to 200 kOhm/square. The thickness of the electrode layer is preferably in the range from 20 to 100 nm.

The electrode layer is preferably deposited on to an insulating layer. The insulating layer suitably forms a cover for the thin-film transistor circuit.

The electrode layer is suitably transparent or semi-transparent (e.g. with a transparency of greater than 50%), at least at the frequency of any light emissions from the active layer, and suitably in the visible spectrum.

The conductive organic material of the electrode layer is suitably a conductive polymer material. The conductive organic material may be a polyaniline (e.g. a doped polyaniline or polyaniline derivative—see M. Angelopoulos et al., "Applications of Conducting Polyanilines in Computer Manufacturing Processes", Intrinsically Conducting Polymers: An Emerging Technology, M. Aldassi (ed.), Proceedings of the NATO Advanced Research Workshop on Applications of Intrinsically Conducting Polymers, Burlington Vt. USA, pp 147–156, 1993 Kluwer Academic Publishers, Netherlands), a polythiophene (e.g. a doped polythiophene or polythiophene derivative), a polypyrrole, a doped conjugated polymer such as doped PPV. One preferred material is polystyrene sulphonic acid doped polyethylene dioxythiophene ("PEDT/PSS").

The electrode layer suitably comprises a lower electrode layer in electrical contact with the output of the thin-film transistor circuit and an upper electrode layer adjacent to the active region. The upper electrode layer is preferably of a different composition and/or has different electrical properties from the lower electrode layer. For example, the lower electrode layer preferably has a higher electrical conductivity (suitably with a sheet resistance below 1000 Ohm/square) than the upper electrode layer (suitable with a sheet resistance above 200 kOhm/square). Where the electrode comprises PEDT/PSS the upper electrode layer has a higher concentration of polystyrene sulphonic acid ("PSS"than the lower electrode layer.

The output of the thin-film transistor circuit suitably comprises a contact for making electrical connection to the electrode. The contact suitably extends in the major. plane of the electrode for improving electrical contact between the two and/or charge distribution in the electrode. For example, the contact suitably extends along one or more sides of the electrode layer. The contact may surround or substantially surround the electrode layer, at least in the plane of the layer. The contact is preferably of a material of a higher conductivity than that of the electrode layer. To avoid direct carrier injection from the contact into the active region (if the device is configured so that the two are adjacent) the work function of the material of the contact is preferably lower than that of the material of the electrode layer and/or the contact may be coated with an insulating layer over its surface adjacent to the active region. The work function of the material of the contact is suitably less than 4.5 eV and preferably less than 4.3 eV. The material of the contact is preferably inert to acids, such as sulphonic acid. Preferred materials for the contact include metals, such as aluminium and aluminium alloys, and conductive refractory materials such as titanium nitride. Preferably the conductivity of the contact is greater than that of the material of the electrode.

The electrode layer preferably abuts the said insulating layer over one major surface. The other major surface of the electrode layer preferably abuts a major surface of the active region. The other major surface of the active region preferably abuts another electrode layer. Either electrode layer may be the anode or the cathode.

Where the active layer can control the polarisation of light passing through it the device may also preferably comprise one or more polarising layers and/or a reflective layer and/or a light-emitting layer, as is well known in the fabrication of prior liquid crystal devices.

According to a second aspect of the invention there is provided a method for forming an organic light-emitting display device, comprising: depositing a thin-film transistor switch circuit on a substrate; depositing an electrode layer of light transmissive conductive organic material in electrical contact with the output of the thin-film transistor circuit; and depositing an organic light-emitting layer over the electrode layer. The details of this aspect of the invention are as for the first aspect of the invention.

The methods described above may suitably allow for the formation of a device having a plurality of pixels as described above, preferably with a common substrate but individual thin-film transistor switch circuits and electrode layers and separate organic light-emitting regions for each pixel. The electrode layer (or a sub-layer of the electrode layer) may extend contiguously across all the pixels of the device, particularly where that layer or sub-layer has a sheet resistance greater than 200 kOhm/square. The device may be a multi-colour display, having a set of pixels of different emission colours, e.g. red green and blue.

The present invention will now be described by way of example with reference to the accompanying drawings, in which.

Figure 1:
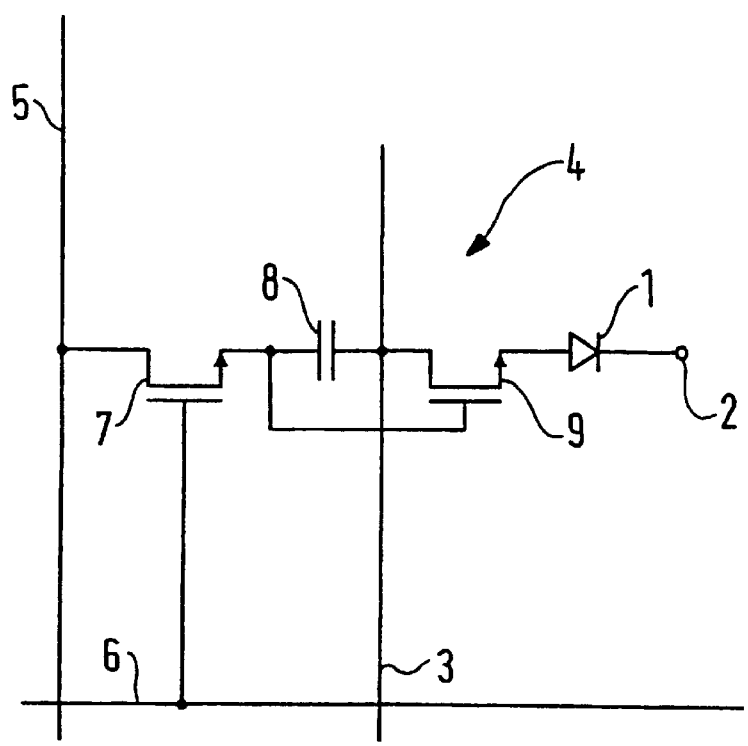

The figures are not to scale. Like parts are given the same reference numerals in each figure. The banks 30 are not shown in the plan views.

Figure 2:
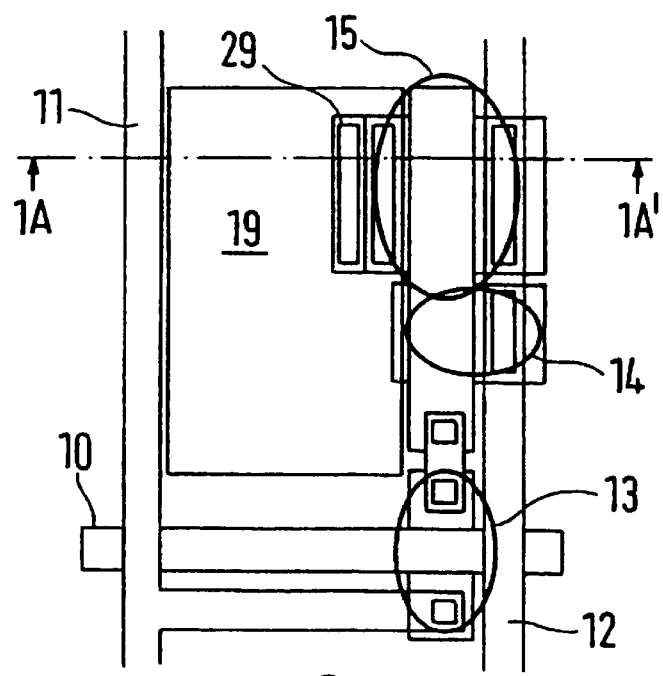
Figure 3:
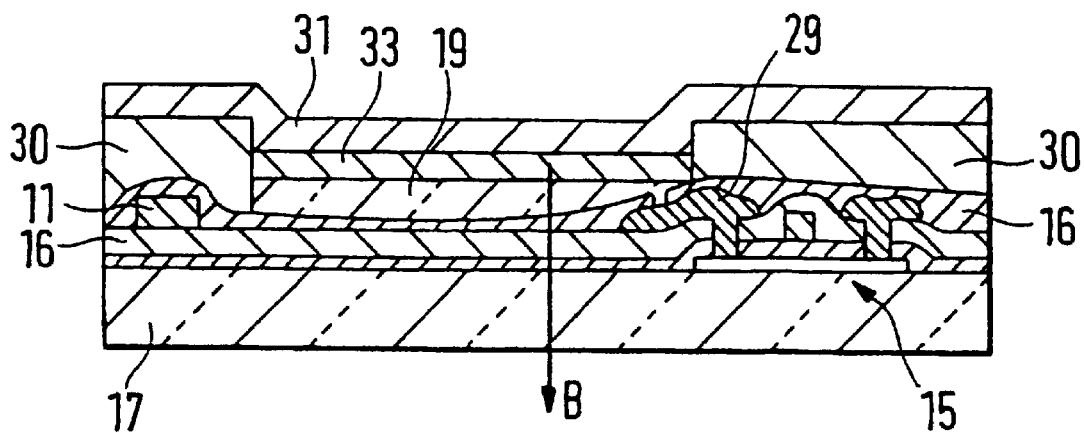
Figure 4:
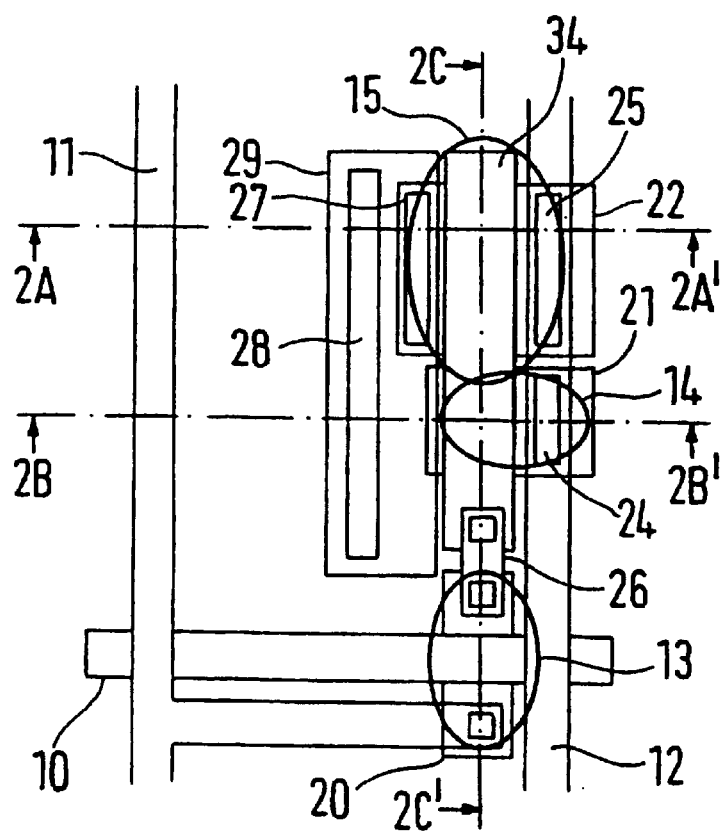
FIG. 4 shows a schematic plan view of the switching circuitry associated with a pixel of an organic light-emitting device.

FIGS. 4 to 10 show an organic light-emitting device similar to that of FIGS. 2 and 3. In the device of FIGS. 4 to 10, however, the ITO region 19 of FIGS. 2 and 3 is replaced by a region 32 of an electrically conductive polymer material.

Figure 5:
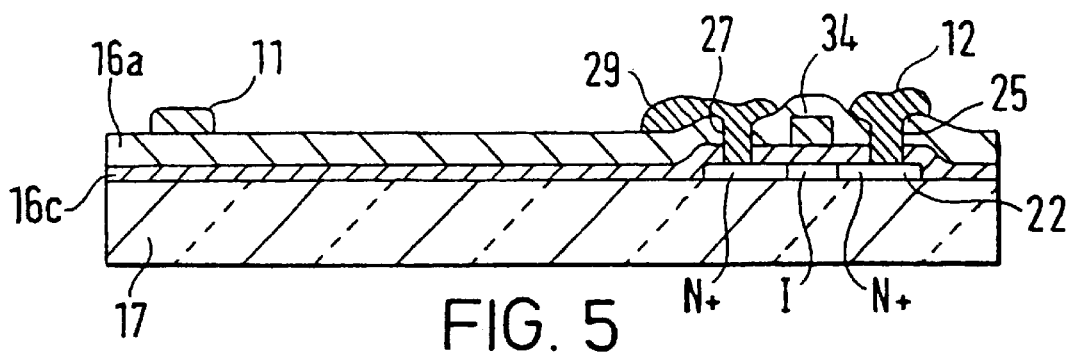
FIGS. 5 to 8 illustrate stages in the fabrication of the circuitry of FIG. 4 as cross-sections on the line 2A–2A'.
Figure 6:
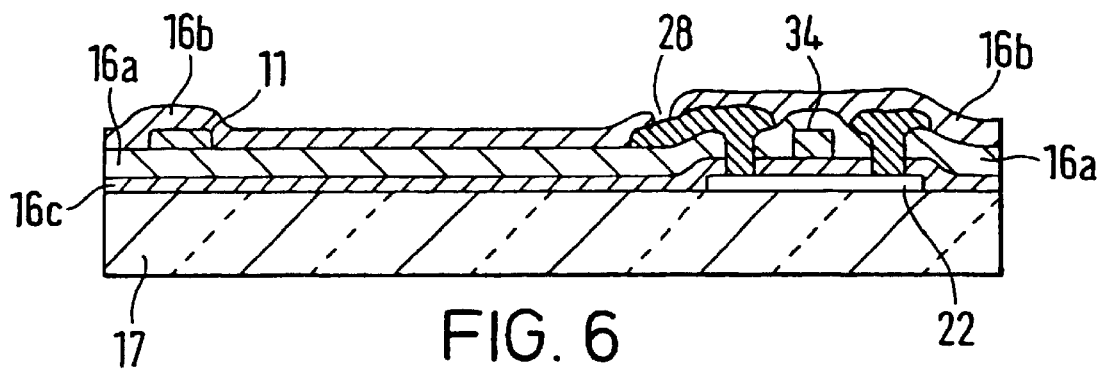
Figure 7:
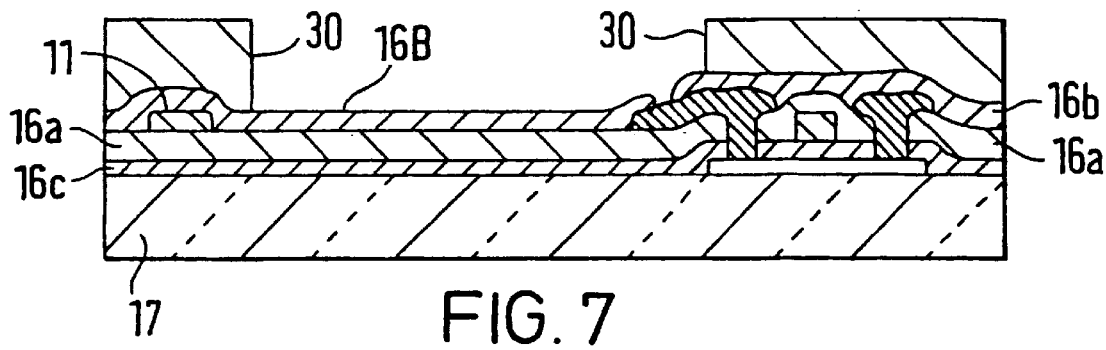
Figure 8:
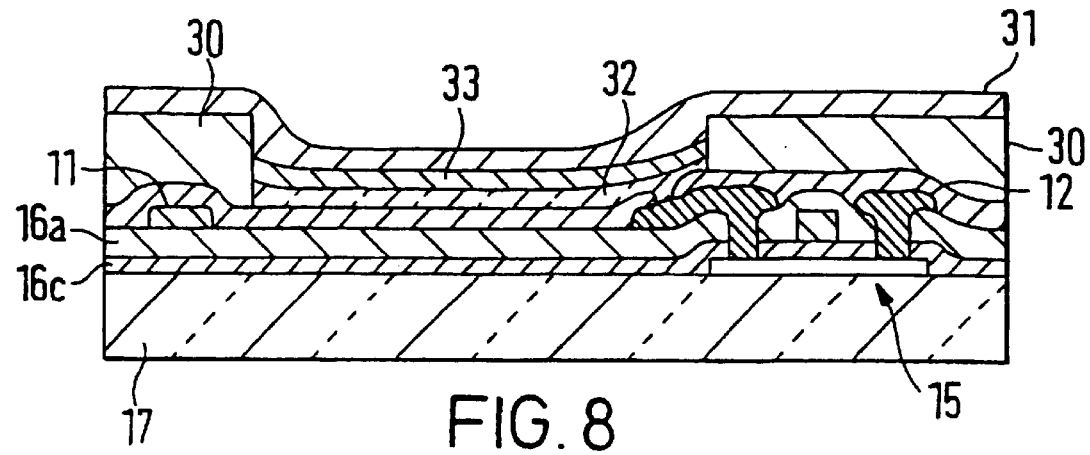
Figure 9:
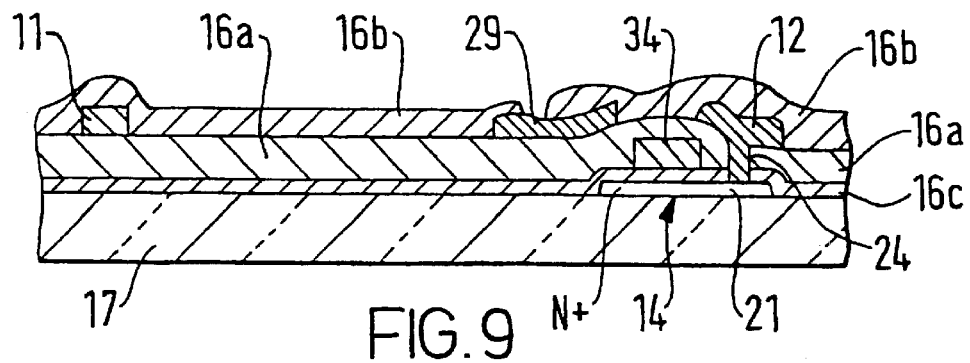
FIG. 9 shows a cross-section on the line 2B–2B' in FIG. 4 at the stage in fabrication illustrated by FIG. 6.
Figure 10:
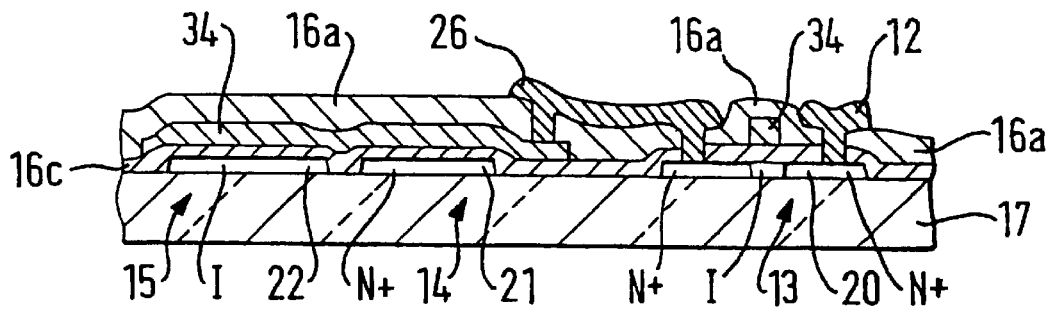
FIG. 10 shows a cross-section on the line 2C–2C' in FIG. 4 at the stage in fabrication illustrated by FIG. 5.

To form the device shown in FIGS. 4 to 10 the TFT circuitry is first deposited on to the glass substrate 17 in the normal way to achieve the stage shown in cross-section in FIG. 5. First, polysilicon regions 20, 21, 22 are deposited and doped (as shown by N+) for the transistor switching TFT 13, the capacitor 14 and the current TFT 15 respectively. (The doping is done later by ion implantation after a step of patterning gate metallisation layer 34). Then a gate insulating layer 16c is deposited over the polysilicon, followed by a gate metallisation layer 34. Another insulating layer 16a of $SiO_2$ is formed over that. Contact holes 24, 25, 27 are made through the layers 16a and 26c. There are three types of contact holes: the first is opened through the layers 16a and 26c, the second is opened through the layer 16a (shown in FIG. 10) and the third. is opened through the layer 16b (shown in FIG. 6). Then signal line 11, common line 12, connector 26 and contact region 29 are deposited in a single metal deposition step (which also fills the holes 24, 25 and 27) and patterned. This achieves the structure of FIG. 5.

A third insulating layer 16b of $SiO_2$ is deposited over the circuitry and a contact hole 28 made in it. This achieves the structure of FIG. 6.

In this embodiment the banks 30 are made of a polyimide material. This is deposited to achieve the structure of FIG. 7.

Conductive polymer material is then deposited to form the anode of each pixel. The material is deposited so as to spread over the insulating layer 16b and fully between the banks 30, making. electrical contact with the contact region 29 through the hole 28, to provide a uniform layer 32 over the light-emissive area of the pixel. The conductive polymer could be deposited by numerous means, for example spin-coating or ink-jet printing as described in more detail below in connection with the light-emitting layer.

The organic light-emitting material in this example is PPV. The PPV could be deposited as a layer over the entire device (e.g. by spin-coating a precursor polymer) and then patterned to form individual pixels, or the light-emitting material of each pixel could be deposited separately (e.g. by ink-jet printing). The resulting light-emitting pixel layer 33 is around 1000 Å thick. To deposit the light-emitting material by ink-jet printing the material is sprayed through an ink-jet printer spray head. A suitable spraying cycle is 14,400 drops per second, with a drop volume of 30 pl. It is especially convenient to deposit the light-emitting material by ink-jet printing when the conductive polymer layer has been deposited by ink-jet printing because this simplifies the production process.

Finally, a cathode layer 31 is deposited over the PPV. (See FIG. 8).

The pixel of FIGS. 4 to 10 forms part of a larger light-emitting device in which several thousand such pixels are arranged in orthogonal rows and columns. For instance, one typical size is 800 columns by 600 rows, giving a total of 480,000 pixels. The device could even be a colour display device having equal numbers of red, green and blue pixels. A typical pixel size is 300×100 µm.

The performance of the device can be improved by careful control of the resistances of the layers involved. The resistance of the current transistor of the TFT circuit of a pixel when in the on state should be lower than the combined resistance of the conductive organic electrode layer and the light-emitting layer. Typically the on-resistance of the transistor is around 10 kOhm and the on-resistance of an organic light-emitting layer together with the conductive layer around 1 MOhm. For uniformity, the resistance of the conductive organic electrode layer is preferably less than that of the organic light-emitting layer. Good targets are for the total on-resistance of the transistor and the conductive layer to be at least a factor of 10 lower than that of the organic-light emitting layer and/or for the on-resistance of the transistor to be at least a factor of 10 lower than the total on-resistance of the conductive layer and the organic-light emitting layer.

Some variations on the device described above will now be described.

Instead of an organic polymer light-emitting layer the device could have a light-emitting layer of another organic material, for instance a small molecule material such as $Alq_3$ or an oligomer material, or of an inorganic material. A liquid crystal layer could replace the light-emitting layer, and the usual polarisers, back-lights etc. added to form a liquid crystal display.

The conductive layer 32 could be configured in a number of different ways. One preferred possibility is to provide a conductive bridging piece extending upward from the contact 29 to the conductive material 32. The bridging piece could be in the form of a leg which merely fills the hole 28. The bottom of such a leg would make electrical contact with the contact 29. The top would be flush with the top of the insulating layer 16b and would make electrical contact with the layer 32 in a localised region at the upper end of the leg. The bridging piece could be of a different material from the conductive layer 32, for instance of aluminium.

Another possibility is to extend the contact with the conductive layer 32 laterally, in one or both directions in the major plane of the conductive layer 32, to improve the performance of the device. By extending the bridging piece laterally a larger zone of contact with between the conductive layer 32 can be provided. FIGS. 11 to 14 show examples of this. FIGS. 11 to 14 also take advantage of the fact that the insulating layer 16b can be omitted provided the banks 30 are present because only one of those structures is required for insulating the signal line 11 from the conductive layer 32. (Alternatively, the banks 30 could be omitted when the insulating layer 16b is present).

Figure 12:
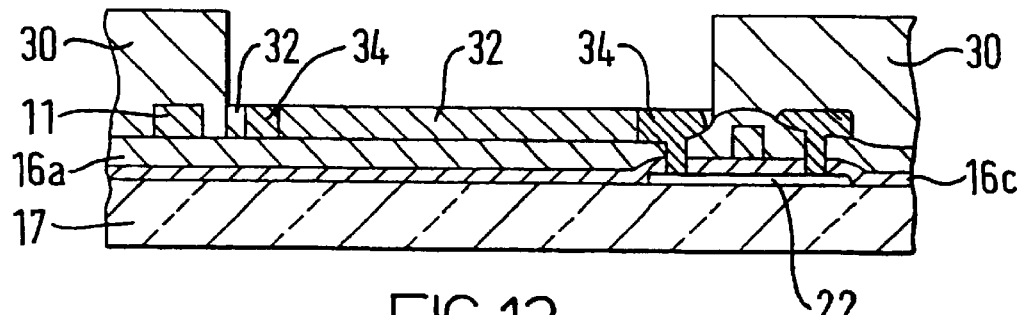
FIG. 12 shows a cross-section on the line 3A–3A' in FIG. 11.
Figure 14:
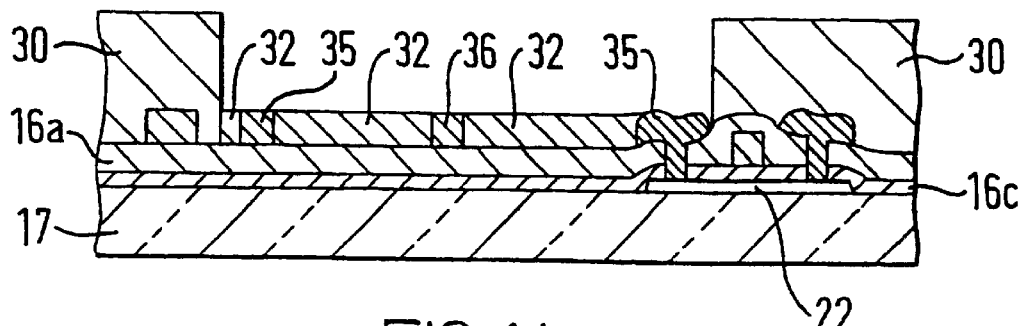
FIG. 14 shows a cross-section on the line 4A–4A' in FIG. 13.
Figure 11:
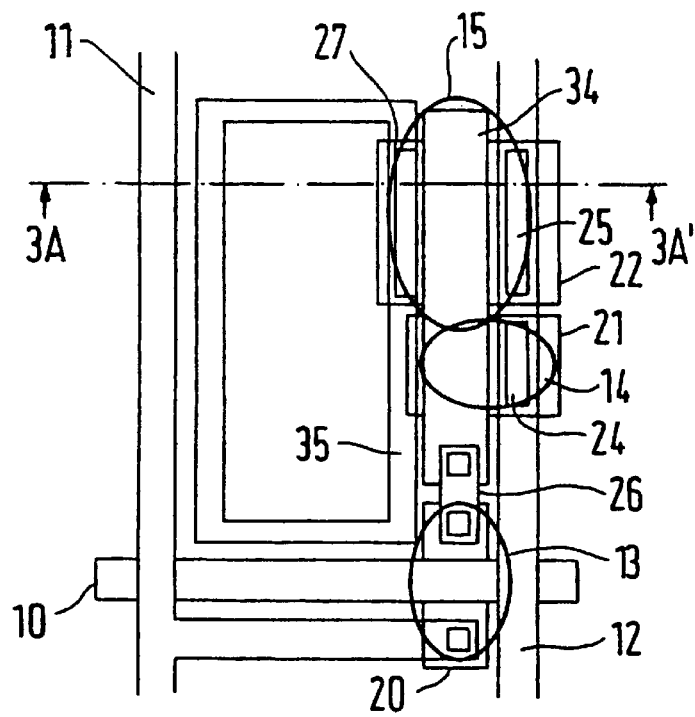
FIG. 11 shows a schematic plan view of alternative switching circuitry associated with a pixel of an organic light-emitting device.
Figure 13:
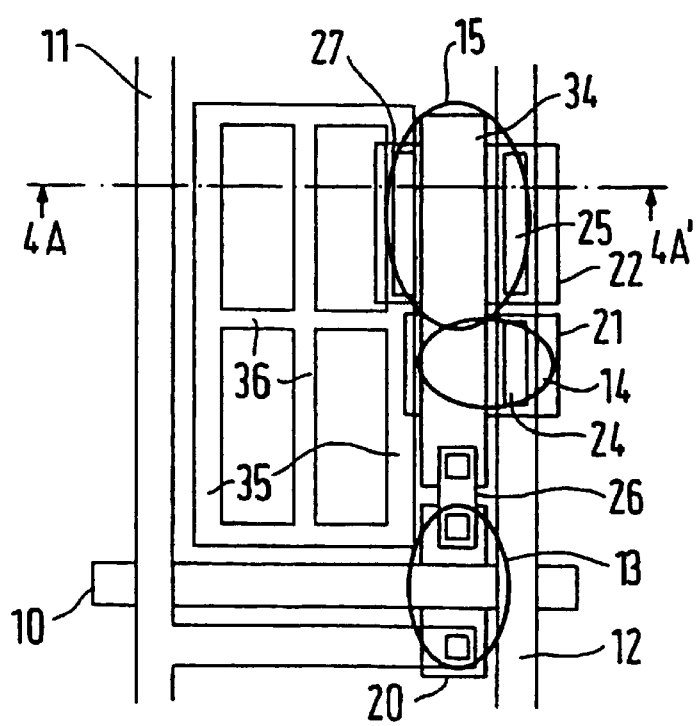
FIG. 13 shows a schematic plan view of other alternative switching circuitry associated with a pixel of an organic light-emitting device.

In FIGS. 11 and 12 the contact 29 projects into the layer 32. In addition the contact 29 is extended in two directions to form a low-resistance frame 35 near the periphery of the light-emitting region. In FIGS. 13 and 14 a similar frame 35 is supplemented by cross members 36 which cross the light emitting region. In another embodiment the members 36 could be replaced by more complex network of conductors crossing the electrode 32 but sufficiently fine to not significantly block light output from the pixel. An enlarged zone of electrical contact with the conductive layer 32 can allow for lower current densities and a more uniform distribution of charge across the electrode, especially if the conductivity of the material from which the electrode is made is relatively low.

Other conductive materials than aluminium could be used for the bridging piece or part of it Preferred materials are those that do not substantially inject charge themselves into the light-emitting region 33 if they are in contact with it, because this may lead to non-uniform emission from the region and reduced efficiency if the conductive material is opaque and blocks from a viewer the light that is emitted behind it In general, to achieve this the work function of the conductive material should be less than that of the conductive polymer material of the layer 32. Where the light emitting material is PPV and the conductive polymer is PEDT/PSS suitable conductive materials to replace the aluminium (at least where it contacts the light-emitting layer 33) include aluminium alloys (e.g. Al:Si alloys), tantalum and the like. Another way to avoid direct injection from the bridging piece into the light-emitting material is by coating the parts of the bridging piece that would otherwise make contact with the light-emitting material with an insulator such as $SiO_x$ or $AlO_x$. Nevertheless, good contact must be maintained between the conductive material of the bridging piece and the conductive polymer 32.

Another issue is the need to avoid deleterious reactions between the conductive polymer material and the conductive material with which it is in contact (whether a contact 29 or a bridging piece). For example, the acid that is present in the PEDT/PSS can attack aluminium. Therefore, a refractory metal or alloy such as Mo, W, $MoSi_2$, Ti, Ta, $WSiO_2$ or TiN, or a multi-layer including such materials, may be preferred for that conductive material, or at least the portion of it that is to make contact with the conductive polymer material. Such a material may also be less prone to oxidation and therefore maintain a better (ohmic) contact at the interface with the conductive polymer material. There should be low contact resistance at the interface between the contact 29 or bridging piece and the conductive polymer material. For example, one preferred structure for the contact in FIG. 12 is to form it as a multi-layer structure of Ti/TiN/Al/TiN at thicknesses of 20/50/600/50 nm respectively. In this structure the first Ti layer is to provide. a good contact with the n+polysilicon 22, the TiN is a barrier layer to avoid formation of Al:Si alloys, the Al provides the bulk of the leg with low resistance, and the top layer of TiN is to provide a good contact with the PEDT/PSS layer 32. These layers can be formed by sputtering under the following conditions:

| Composition of layer | Sputter target | Sputter atmosphere | Pressure | Sputtering power |
| --- | --- | --- | --- | --- |
| TiN | Ti | N at 33 sccm Ar at 50 sccm | 0.2 Pa | 1–2 kW |
| Ti | Ti | Ar at 60 sccm | 0.2 Pa | 1–2 kW |
| Al | 99.5% Al, 0.5% Cu | Ar at 80 sccm | 0.3 Pa | 1–2 kW |

It is preferred that the conductive polymer electrode should have a resistivity of 1 to 10 Ohm cm or less. Preferred sheet resistances are in the range from 200 to 1000 Ohms/square or less.

Alternatives to ink-jet printing of the conductive polymer electrode include spin- or blade-coating. These methods would yield a uniform layer of conductive material which would then be patterned to give each pixel an individual electrode. The patterning could be by standard photolithographic techniques using dry or wet etching. Another alternative is to use a patterning technique as described in WO 96/08047 or EP 0 615 257, e.g. to expose the areas of PEDT/PSS between the pixels to ultraviolet light so as to render them non-conductive.

It may be useful to form the conductive polymer electrode of two layers: a lower layer which makes contact with the contact 29 at the output of the TFT circuitry, or the conductive bridging portion which leads from the contact 29, and an upper one which makes. contact with the light-emitting layer. This would allow each layer to be optimised for conductivity and/or electrical contact with the respective adjacent material. For instance, although increasing the concentration of PSS in a PEDT/PSS layer increases the layers resistance, it tends to improve the performance of the light-emitting device. Therefore, the conductive polymer electrode could be formed as a lower layer abutting the contact 29 and an upper layer lying across the lower layer and having a higher concentration of PSS and a higher resistance than the lower PEDT/PSS layer. The upper and lower layers would meet and make electrical contact across their lower and upper major surfaces respectively. The resistance of the upper layer may be so high that there is little risk of problems from lateral diffusion of charge within the layer. (The resistance where this applies depends on the spacing between the pixels and other device parameters, but might typically be around 200 Ohms/square). In that case the upper layer need not be patterned into separate regions for each pixel but could be contiguous over the entire device, or at least a plurality of pixels.

The present invention may include any feature or combination of features disclosed herein either implicitly or explicitly or any generalisaton thereof irrespective of whether it relates to the presently claimed invention. In view of the foregoing description it will be evident to a person skilled in the art that various modifications may be made within the scope of the invention.

What is claimed is:

1. A method for forming a display device, comprising the steps of:
   depositing a thin-film transistor switch circuit having an output on a substrate;
   depositing by ink-jet printing an electrode layer of light transmissive conductive organic material in electrical contact with the output of the thin-film transistor circuit; and
   depositing an active region of the device over the electrode layer.

2. A method as claimed in claim 1, comprising the step of depositing the active region by ink-jet printing.

3. A method as claimed in claim 1, wherein the active region is a light-emitting region.

4. A method as claimed in claim 3, wherein the light-emitting region comprises an organic light-emitting material.

5. A method as claimed in claim 4, wherein the light-emitting material comprises at least one of a polymer and a co-polymer material.

6. A method as claimed in claim 4, wherein the light-emitting material is a conjugated material.

7. A method as claimed in claim 4, wherein the light-emitting material is poly(p-phenylenevinylene) or a derivative thereof.

8. A method as claimed in claim 1, wherein the electrode layer has a sheet resistance in the range from 20 to 200 kOhm/square.

9. A method as claimed in claim 1, wherein the conductive organic material is a conductive polymer material.

10. A method as claimed in claim 1, wherein the conductive organic material is polystyrene sulphonic acid doped polyethylene dioxythiophene.

11. A method as claimed in claim 1, wherein the electrode layer comprises a lower electrode layer in electrical contact with the output of the thin-film transistor circuit and an upper electrode layer adjacent to the active region and of a different composition from the lower electrode layer.

12. A method as claimed in claim 11, wherein the lower electrode layer has a higher conductivity than that of the upper electrode layer.

13. A method as claimed in claim 12 wherein the conductive organic material is polystyrene sulphonic acid doped polyethylene dioxythiophene and the upper electrode layer has a higher concentration of polystyrene sulphonic acid than the lower electrode layer.

14. A method as claimed in claim 1, wherein the output of the thin-film transistor circuit comprises a contact having a work function extending along one side of the electrode layer, of a material of a higher conductivity than that of the electrode layer.

15. A method as claimed in claim 14, wherein the contact extends along two or more sides of the electrode layer.

16. A method as claimed in claim 14, wherein the work function of the material of the contact is lower than that of the material of the electrode layer.

17. A method as claimed in claim 14, wherein the material of the contact is a metal or alloy.

18. A method as claimed in claim 14, comprising the step of depositing an insulating layer over part of the contact to insulate that part of the contact from the light-emitting layer.

19. A method for forming an organic light-emitting display device, comprising the steps of:

depositing a thin-film transistor switch circuit having an output on a substrate;

depositing an electrode layer of light transmissive conductive organic material comprising a sheet resistance of less than 1000 Ohm/square in electrical contact with the output of the thin-film transistor circuit; and depositing an organic light-emitting layer over the electrode layer.

20. A light-emitting device formed by the method of claim 1.

21. A light emitting device formed by the method of claim 19.

* * * * *